United States Patent
Rokhsaz et al.

[11] Patent Number: 5,933,040
[45] Date of Patent: Aug. 3, 1999

[54] METHOD AND APPARATUS FOR A DATA DETECTION CIRCUIT OPERATING FROM A LOW VOLTAGE POWER SOURCE

[75] Inventors: Shahriar Rokhsaz; Mathew A. Rybicki; H. Spence Jackson, all of Austin, Tex.

[73] Assignee: Sigmatel, Inc., Austin, Tex.

[21] Appl. No.: 08/871,217

[22] Filed: Jun. 9, 1997

[51] Int. Cl.[6] ........................................ H03L 5/00
[52] U.S. Cl. ...................... 327/306; 327/315; 330/207 A
[58] Field of Search ................................ 327/306, 315, 327/318, 319; 330/10, 251, 207 A

[56] References Cited

U.S. PATENT DOCUMENTS

| | | | |
|---|---|---|---|
| 4,599,571 | 7/1986 | Matsuno | 330/11 |
| 4,870,367 | 9/1989 | Nakase et al. | 328/168 |
| 5,103,675 | 4/1992 | Komninos | 73/592 |
| 5,371,479 | 12/1994 | Hagerty | 330/294 |
| 5,436,556 | 7/1995 | Komninos | 324/76.23 |
| 5,510,753 | 4/1996 | French | 330/146 |

*Primary Examiner*—Timothy P. Callahan
*Assistant Examiner*—An T. Luu
*Attorney, Agent, or Firm*—Timothy W. Markison

[57] ABSTRACT

A method and apparatus for detecting pulse data is accomplished by a low voltage data detection circuit that includes a preamplifier circuit, an amplification stage, and a scaling circuit. The preamplifier circuit has a differential input, a predefined gain, and a maximum output limit and receives an input signal, which has a wide dynamic range. The preamplifier circuit amplifies the input signal based on the predefined gain to produce a preamplified data signal. The preamplified data signal is again amplified by the amplification stage and subsequently provided to the scaling circuit which scales the amplified data signal to a predetermined level. The resulting scaled data signal maintains the pulse width fidelity of the input data signal.

14 Claims, 5 Drawing Sheets

METHOD AND APPARATUS FOR A DATA DETECTION CIRCUIT OPERATING FROM A LOW VOLTAGE POWER SOURCE

TECHNICAL FIELD OF THE INVENTION

This invention relates generally to data detection circuit and more particularly to a data detection circuit powered by a low voltage source to receive a data signal having a large dynamic range.

BACKGROUND OF THE INVENTION

Transmission of digital data is well-known in the art. Such transmission may occur over wire-lined transmission paths or wireless transmission paths. Such wireless transmission paths include radio frequency and infrared (IR). For IR transmissions, a light transmitting diode is pulsed on and off to generate a light pulse, which is subsequently received by a light receiving diode. Such wireless IR communication requires that the receiving transmission diode be in the line of sight with the transmitting diode A wide variety of circuits utilize infrared transmission paths to communicate data from one device to another. For example, remote controls for televisions, radios, amplifiers, etc. use IR transmission paths to transmit data from the remote controller to the particular device. Current infrared technology developments have enabled computers to utilize infrared transmission paths. For example, an IR communication path may be established between a computer's central processing unit (CPU) and a printer. Utilizing such an IR path is based on an iRDA transmission standard of 4 PPM (four pulse position modulation).

4 PPM incorporates 500 nSec time slots to obtain a four megabits per second data rate. Each of the 500 nSec times slots are divided into four sections; where a data pulse may resided in any one of the four sections. If the pulse resides in the first section of a time slot, the data pulse represents a binary value of 00, if the pulse resides in the second section of the time slot, the data pulse represents a binary value of 01; if the pulse resides in the third section, the data pulse represents a binary value of 10, and if the pulse resides in the fourth section, the data pulse represents a binary value of 11.

A difficulty arises with infrared transmission due to the wide dynamic range of the infrared signal being transmitted. For example, if the transmitting diode and receiving diode are in close proximity (less than 0.25 meters), the current through the receiving diode may be as much as 10 mAmps. If, however, the transmitting diode and receiving diode are a substantial distance apart (greater than 2 meters), the current through the receiving diode may be as small as a 100 nAmps.

When the current through the receiving diode is approximately 100 nAamps it can be difficult to detect when a pulse exists and in which section of a time slot it resides. Typically, to detect the presence of a pulse, a comparison circuit is to compare an incoming data signal, which has been amplified, to a predetermined threshold. As apparent, when the magnitude of the incoming data signal is large, it is easy to detect its. Conversely, when the magnitude of the incoming data signal is small, the ability to detect its presence becomes difficult, resulting in valid pulses not be detected.

One solution to more accurately detect small magnitude data signals (Eg. 100 nAmp data signals created by a light receiving diode) is an adaptive threshold circuit. The adaptive threshold circuit generates an adaptive threshold, which is a fixed threshold plus a representation of the magnitude of the data signal. As such, the adaptive threshold is based on the magnitude of the data signal regardless of the magnitude of the data signal. A difficulty arises with the adaptive threshold circuit, in that, when the magnitude of the data signal is very small, it is undetected because of the representation portion of the adaptive threshold. When pulses go undetected, the transmitted data is corrupted and unusable.

Currently, there are several infrared data detection circuits that operate off of a five-volt power supply. These circuits, however, are not designed to operate from, nor do they function when powered by, a low-voltage power supply, such as three-volts. In addition, the currently available infrared data detection circuits are very sensitive to variances in the characteristics of the light receiving diode. If the light receiving diode characteristics change considerably, many of the five-volt powered infrared data detection circuits will not function. Therefore, a need exists for a method and apparatus for an infrared data detection circuit that operates at low power and is relatively insensitive to changes in the light receiving diode characteristics.

DETAILED DESCRIPTION OF THE DRAWINGS

Generally, the present invention provides a method and apparatus for detecting pulse data. This may be accomplished by a low voltage data detection circuit that includes a preamplifier circuit, an amplification stage, and a scaling circuit. The preamplifier circuit has a differential input, a predefined gain, and a maximum output limit and receives an input signal, which has a wide dynamic range. The preamplifier circuit amplifies the input signal based on the predefined gain to produce a preamplified data signal. The preamplified data signal is again amplified by the amplification stage and subsequently provided to the scaling circuit which scales the amplified data signal to a predetermined level. The resulting scaled data signal maintains the pulse width fidelity of the input data signal. With such a method and apparatus, the present invention provides a data detection circuit that is operable from a low-voltage power source and is indifferent to changes in the diode characteristics of light receiving diodes which provide the input data signal.

Figure 1:
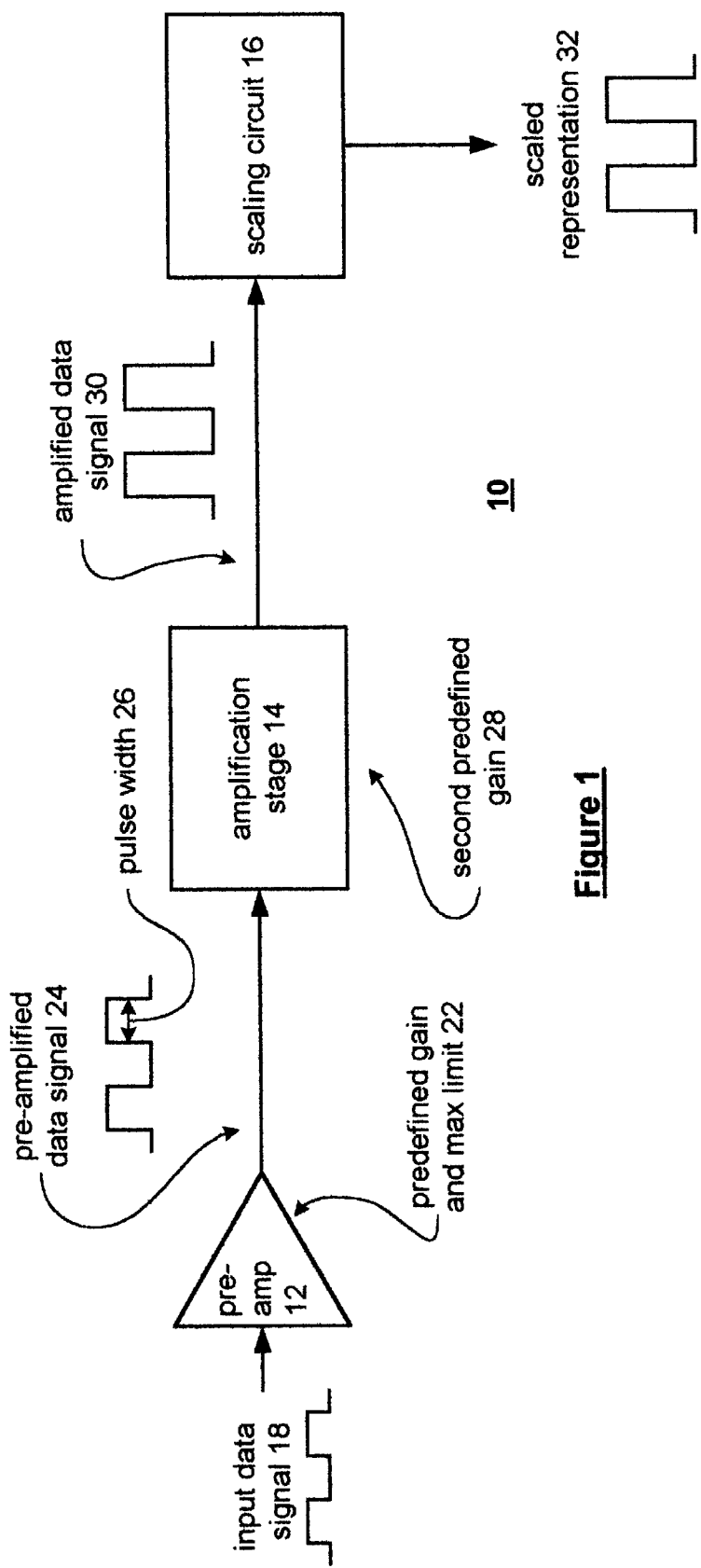
FIG. 1 illustrates a schematic block diagram of a data detection circuit in accordance with the present invention.

The present invention can be more fully described with reference to FIGS. 1 through 5. FIG. 1 illustrates a schematic block diagram of a low voltage data detection circuit 10 which includes a preamplifier circuit 12, an amplification stage 14, and a scaling circuit 16. The preamplifier circuit 12 is operably coupled to a low-voltage power source 20, which may be a three-volt power source. In operation, the preamplifier circuit 12 receives an input data signal 18, which has a wide dynamic range and a pre-established pulse width The preamplifier circuit 12 amplifies, based on a predefined gain and maximum output limit 22, the input data signal 18 to produce a preamplified data signal 24. The amplification stage 14 amplifies the preamplified data signal 24 based on a second predefined gain 28 to produce the amplified data signal 30. The preamplifier circuit 12 and the amplification stage 14 maintain the pulse width 26 integrity of the input data signal when producing the preamplified data signal 24 and the amplified data signal 30, respectively.

The amplified data signal 30 is provided to the scaling circuit 18 which scales the data signal 30 to produce a scaled representation of the input data signal 32. The scaled representation 32 maintains the pulse width integrity of the input data signal such that, for four pulse position modulation of infrared signals, the data can be accurately recovered by the low voltage data detection circuit 10.

The preamplifier circuit 12, the amplification stage 14, and the scaling circuit 16 are powered from a low-voltage power source, such as a three volt source. The preamplifier circuit 12 includes a differential input which substantially reduces the effects of changes in the characteristic of light receiving diodes. The preamplifier circuit 12 is described in greater detail in co-pending patent application entitled DATA DETECTION CIRCUIT HAVING A PRE-AMPLIFIER CIRCUIT, filed on Mar. 20, 1997, having the same assignee as the present invention, and having a docket number of SIG970311-1, which is incorporated herein. The scaling circuit 16 includes an enhanced adaptive threshold circuit, peak detection circuit, and a comparison circuit, which is described in greater detail in co-pending patent application entitled METHOD AND APPARATUS FOR DATA DETECTION WITH AN ENHANCED ADPATIVE THRESHOLD, filed on the same day as the present patent application, being assigned to the same assignee as the present application, and having a docket number of SIG970321-1.

Figure 2:
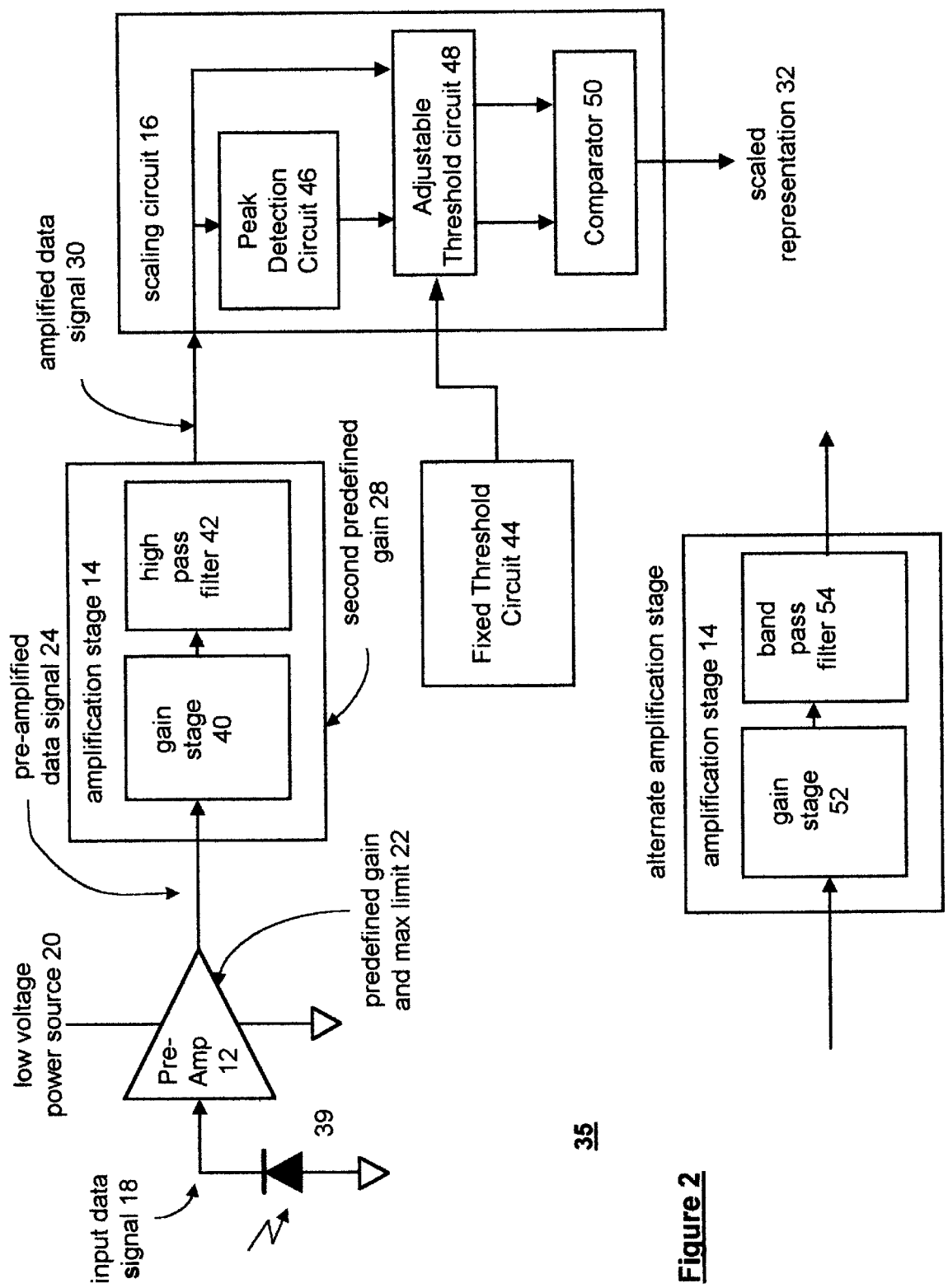
FIG. 2 illustrates a schematic block diagram of an alternate embodiment of a data detection circuit which is in accordance with the present invention.

FIG. 2 illustrates a schematic block diagram of an alternate data detection circuit 35 which includes the preamplifier circuit 12, a light receiving diode 39, the amplification stage 14, the scaling circuit 16, and a fixed threshold circuit 44. The amplification stage 14 is shown to include a gain stage 40 and a high pass filter 42 which may be an integrator coupled as feedback around the gain stage 40. This embodiment of the amplification stage 14 would be used for fast IR transmissions, such as 4 PPM. As an alternate, the amplification stage 14 may include a gain stage 52 and a band-pass filter 54. This alternative embodiment of the amplification stage 14 may be used for slow IR transmission, such as 100 KHz transmissions. The scaling circuit 16 is shown to include a peak detection circuit 46, an adjustable threshold circuit 48, and a comparator 50.

In operation, when the light receiving diode 39 receives a light pulse, which may be transmitted using 4 PPM, it provides a current based representation of the input data signal 18 to the preamplifier circuit 12. The preamplifier circuit 12 amplifies the representation of the input data signal by a predefined gain, up to a maximum output limit, to produce the preamplified data signal 24. The amplification stage 14, via the gain stage 40, amplifies the preamplified data signal 24 by a second predetermined gain 28. The resultant amplified signal is run through a high pass filter 42 to subsequently produce the amplified data signal 30. Note that the second predetermined gain may be 26 dB while the high-pass filter may have a corner frequency of 500 kHz. Further note that the amplifying by the gain stage and the filtering by the high pass filter may be done simultaneously when the high pass filter is an integrator coupled as feedback around the gain stage.

The scaling circuit 16, as mentioned, includes the peak detection circuit 46, the adaptive threshold circuit 48, and a comparator 50. The peak detection circuit 46 receives the amplified data signal 30 and provides a peak detection signal to the adjustable threshold circuit 48. In essence, the peak detection circuit 46 detects whether the amplified data signal is above a predetermined threshold and thus representative of a valid data pulse. If so, the adjustable threshold circuit 48 generates a mixed signal and a comparison signal from the amplified data signal 30 and a fixed threshold from the fixed threshold circuit 44. In particular, the comparison circuit is an adaptive threshold which is the fixed threshold when the magnitude of the amplified data signal 30 is less than the fixed threshold, and is a proportional threshold when the magnitude of the amplified data signal 30 is greater than the fixed threshold. The mixed signal is a combination of the adaptive threshold and the amplified data signal 30. The comparator 50 compares the two signals to produce the scaled representation 32 of the data signal. The scaled representation 32 is a rail to rail replica of the input data signal and is low when the input data signal is detected and is high when the input data signal is not detected.

The alternate amplification stage 14, as mentioned, is shown to include a gain stage and a band-pass filter 54. The gain stage 52 may have a gain of 26 dB while the band-pass filter may have corner frequencies at 81 kilohertz and one megahertz.

Figure 3:
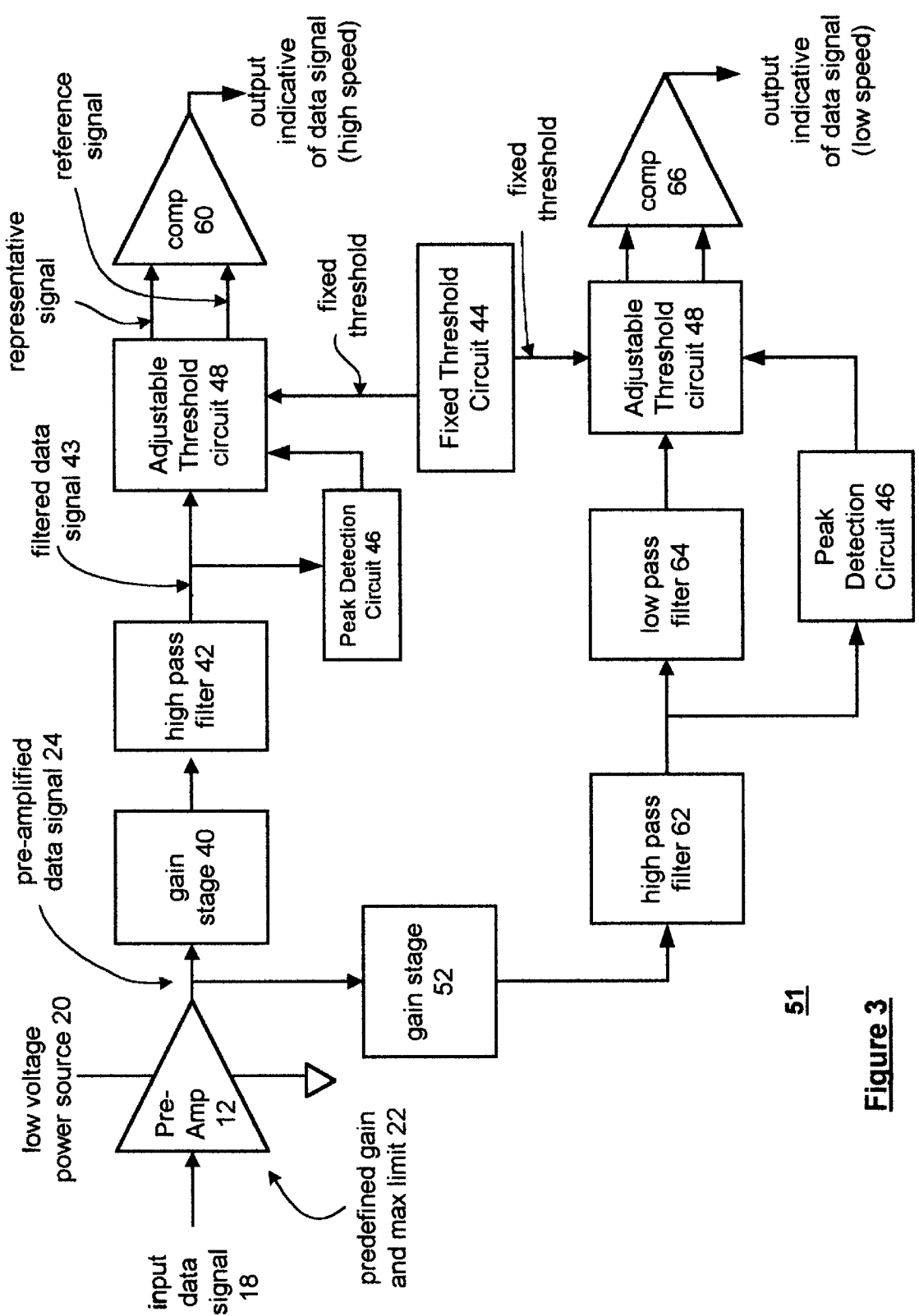
FIG. 3 illustrates a schematic block diagram of yet another alternate embodiment of a data detection circuit which is in accordance with the present invention.

FIG. 3 illustrates a schematic block diagram of a data detection circuit 51 that is capable of receiving high speed infrared transmissions and low-speed infrared transmissions. The high speed transmissions are routed through the preamplifier circuit 12, the gain stage 40, the high pass filter 42, the adjustable threshold circuit 48, and the comparator 60. The low speed transmissions are routed through the preamplifier circuit 12, the gain stage 52, the high pass filter 62, the low-pass filter 64, the adjustable threshold circuit 48, and the comparator 66.

In operation, a high speed infrared transmission, such as four PPM, is received by the preamplifier circuit 12 and amplified to produce the preamplified data signal 24. The preamplified data signal 24 is passed through the gain stage 40 and the high-pass filter 42 to produce a filtered data signal 43. The adjustable threshold circuit 48 receives the filtered data 43, an output from the peak detection circuit 46, and a fixed threshold from the fixed threshold circuit 44 and produces, therefrom, a representative signal and a reference signal. The representative signal and reference signal are received by the comparator 60 which compares the two signals to produce an output indicative of the high-speed data signal. The operation of the low-speed receive path is similar, but includes a low pass filter 64.

Figure 4:
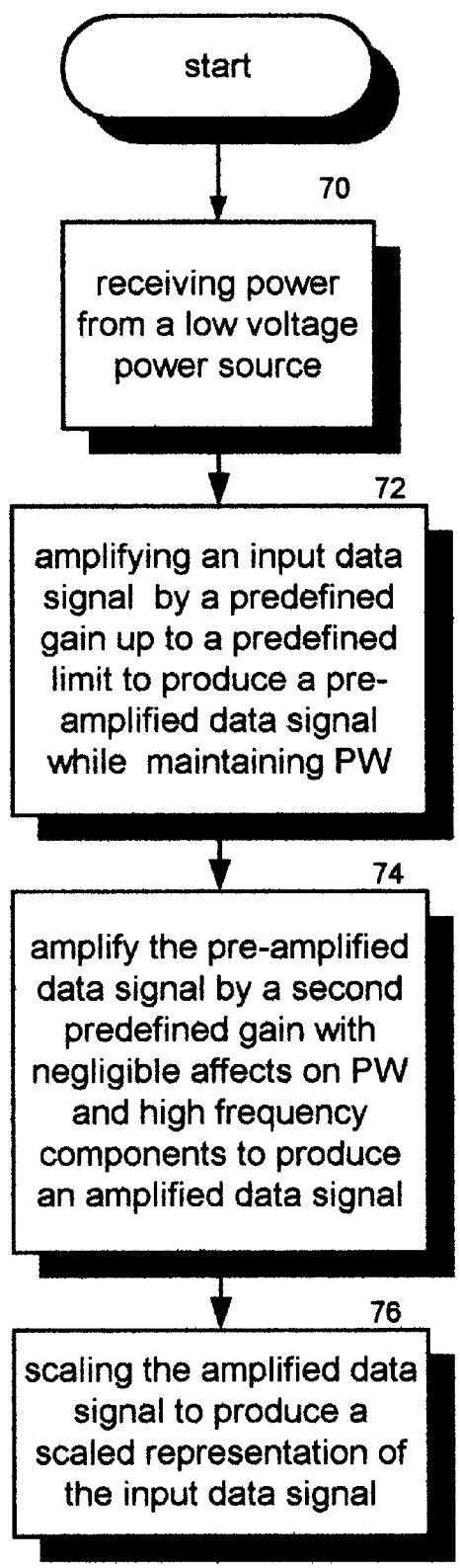
FIG. 4 illustrates a logic diagram that may be used to implement a data detection circuit in accordance with the present invention.

FIG. 4 illustrates a logic diagram that may be used to implement a data detection circuit in accordance with the present invention. The process begins at step 70 where power is received from a low-voltage power source. For the purposes of this discussion, a low-voltage power source is one that provides three and three-tenths volts or less. The process then proceeds to step 72 where an input data signal is amplified by a predefined gain up to a predefined limit to produce a preamplified data signal. Such preamplification maintains the pulse width integrity of the input data signal.

The process then proceeds to step 74 where the preamplified data signal is amplified by a second predefined gain with negligible affects on the pulse width and high-frequency components of the preamplified data signal to produce an amplified data signal. The process then proceeds to step 76 where the amplified data signal is scaled to produce a scaled representation of the input data signal.

Figure 5:
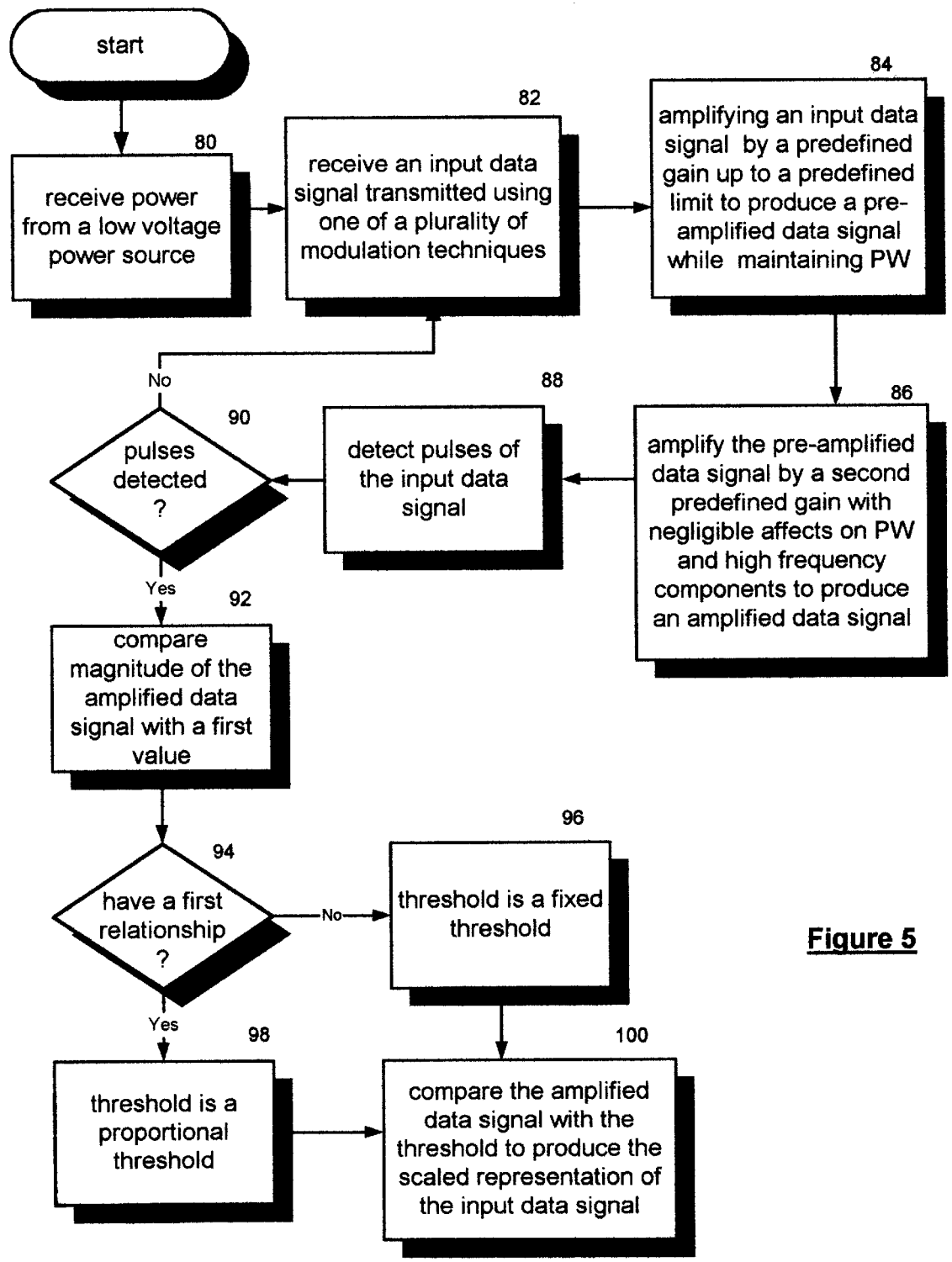
FIG. 5 illustrates a logic diagram which may be used to implement an alternate data detection circuit which is in accordance with the present invention.

FIG. 5 illustrates a logic diagram which may be used to implement an alternate method for data detection in accordance with the present invention. The process begins at step 80 where power is received from a low-voltage power source. The process then proceeds to step 82 where an input data signal transmitted using one of a plurality of modulation techniques is received. A modulation technique may be pulsed position modulation (PPM), amplitude shift king (ASK), or a low-speed transmission modulation in the range of 100 kilobits per second. The process then proceeds to step 84 where an input data signal is amplified by a predefined gain up to a predefined limit to produce a preamplified data signal. Such preamplification maintains the pulse width integrity of the input data signal.

The process then proceeds to step 86 where the preamplified data signal is amplified by a second pre-defined gain with negligible affects on the pulse width and high-frequency components of the input data signal to produce an amplified data signal. The process then proceeds to step 88 where an attempt is made to detect pulses of the input data signal from the amplified data signal. At this stage, the process proceeds to step 90 where a determination is made as to whether pulses were detected. If not, the process returns back to 82.

If, however, pulses are detected, the process proceeds to step 92. At step 92, a comparison between the magnitude of the amplified data signal is made with a first value. The first value may be a fixed threshold. Having made the comparison, the process proceeds to step 94 where a determination is made as to whether a first relationship exists between the magnitude of the amplified signal and the first value. A first relationship may exists when the magnitude of the amplified signal is greater than the first value. If a first relationship exists, the process proceeds to step 98 where a threshold is set to be a proportional threshold which is a fixed threshold plus a scaled representation of the magnitude of the input data signal.

It however, a first relationship does not exist between the magnitude of the amplified data signal and the first value, the process proceeds to step 96 where a fixed threshold is established as the threshold. Regardless of whether the threshold is a fixed threshold or a proportional threshold, the process proceeds to step 100. At step 100, the amplified data signal is compared with the threshold to produce the scaled representation of the input data signal.

The preceding discussion has provided a method and apparatus for a data detection circuit that operates off of a low-voltage power supply and one that is indifferent to light receiving diode characteristic changes. Such a data direction circuit is achieved by using a preamplifier circuit, an amplification stage, and a scaling circuit as described herein.

We claim:

1. A data detection circuit comprising:
   a pre-amplifier circuit operably powered by a low voltage source and to receive an input data signal having a large dynamic range, wherein the pre-amplifier circuit amplifies, with a predefined gain and up to a predefined maximum limit, the input data signal while maintaining pulse width fidelity of the input data signal to produce a pre-amplified data signal;
   amplification stage operably coupled to the pre-amplifier, wherein the amplification stage amplifies the pre-amplified data signal by a second predefined gain with negligible affects to the pulse width fidelity and high frequency components of the pre-amplified data signal to produce an amplified data signal; and
   scaling circuit operably coupled to receive the amplified data signal, wherein the scaling circuit provides a scaled representation of the input data signal, such that the scaled representation has a low noise component and has maintained pulse width of the input data signal.

2. The data detection circuit of claim 1 further comprises, within the scaling circuit,
   peak detection circuit operably coupled to the output of the amplification stage; wherein the peak detection circuit detects peaks of the amplified data signal;
   an adjustable threshold circuit operably coupled to the peak detection circuit and to receive the amplified data signal, wherein the adjustable threshold circuit produces a threshold and a representative signal, wherein the threshold is approximately equal to a fixed threshold when magnitude of the input data signal is less than the fixed threshold and the threshold is approximately equal to a proportional threshold when the magnitude of the input data signal is greater than the fixed threshold; and
   a comparator operably coupled to receive the threshold and the representative signal, wherein an output of the comparator provides the scaled representation of the input data signal.

3. The data detection circuit of claim 1 further comprises a light sensitive diode coupler that provides the input data signal from a light sensitive diode to the preamplification circuit, wherein different light sensitive diodes may have varying diode characteristics.

4. The data detection circuit of claim 3 further comprises the light sensitive diode coupler providing the input data signal to the pre-amplifier circuit, wherein the input data signal has a modulation format of one of: pulse positioning modulation, amplitude shift keying, and return-to-zero inverted.

5. The data detection circuit of claim 1 further comprises, within the amplification stage, a gain stage that provides the second predefined gain and a high pass filter that provides the negligible affects on the high frequency components of the pre-amplified data signal.

6. The data detection circuit of claim 5 further comprises the high pass filter being an integrator.

7. The data detection circuit of claim 1 further comprises, within the amplification stage, a gain stage that provides the second predefined gain and a band pass filter that provides, up to a band pass frequency, the negligible affects on the high frequency components of the pre-amplified data signal.

8. A data detection circuit comprising:
   a pre-amplifier circuit operably coupled to receive an input data signal, wherein the pre-amplifier circuit amplifies, with a predefined gain and up to a predefined limit, the input data signal to produce a pre-amplified signal;
   a gain stage operably coupled to receive the pre-amplified signal and to produce, therefrom, an amplified data signal;
   a high pass filter operably coupled to attenuate low frequency components of the amplified data signal to produce a filtered data signal;
   a fixed threshold circuit that provides a fixed threshold;
   an adjustable threshold circuit operably coupled to receive the filtered data signal and the fixed threshold, wherein the adjustable threshold circuit produces a reference signal and a representation signal, wherein the representation signal is representative of the filtered data signal; and a comparator operably coupled to receive the reference signal and the representation signal and to provide an output indicative of the input data signal.

9. The data detection circuit of claim 8 further comprises:

a second gain stage operably coupled to receive the pre-amplified signal and to produce, therefrom, a second amplified data signal;

a band pass filter operably coupled to attenuate low frequency and high frequency components of the second amplified data signal to produce a second filtered data signal;

a second adjustable threshold circuit operably coupled to receive the second filtered data signal and the fixed threshold, wherein the second adjustable threshold circuit produces a second reference signal and a second representation signal, wherein the second representation signal is representative of the second filtered data signal; and a second comparator operably coupled to receive the second reference signal and the second representation signal and to provide a second output indicative of the input data signal, when the input data signal was transmitted over a low speed infrared transmission path.

10. A method for detecting data, the method comprising the steps of:

a) receiving power from a low voltage power source;

b) amplifying, with a predefined gain and up to a predefined maximum limit, an input data signal that has a large dynamic range while maintaining pulse width fidelity of the input data signal to produce a pre-amplified data signal;

c) amplifying the pre-amplified data signal by a second predefined gain with negligible affects to the pulse width fidelity and high frequency components of the pre-amplified data signal to produce an amplified data signal; and d) scaling the amplified data signal to produce a scaled representation of the input data signal such that the scaled representation has a low noise component and has substantially preserved pulse width of the input data signal.

11. The method of claim 10 further comprises, within step (d):

detecting pulses of the input data signal based on the amplified data signal; and when the pulses are detected, generating a threshold to be a fixed threshold when magnitude of the amplified data signal has a first relationship with a first value and generating the threshold to be a proportional threshold when the magnitude of the amplified data signal has a second relationship with the first value; and comparing the amplified data signal with the threshold to produce the scaled representation of the input data signal.

12. The method of claim 11 further comprises receiving the input data signal prior to the amplifying step (b), wherein the input data signal has a modulation format of one of: pulse positioning modulation, amplitude shift keying, and return-to-zero inverted.

13. The method of claim 10 further comprises, within step (c), high pass filtering the pre-amplified data signal to produce the negligible affects on the high frequency components of the pre-amplified data signal.

14. The method of claim 10 further comprises, within step (c), band pass filtering the pre-amplified data signal to produce, up to a band pass frequency, the negligible affects on the high frequency components of the pre-amplified data signal.

* * * * *